(12) United States Patent
Oshima et al.

(10) Patent No.: US 8,426,942 B2
(45) Date of Patent: Apr. 23, 2013

(54) SEMICONDUCTOR DEVICE WITH A FUSE

(75) Inventors: Masashi Oshima, Yokohama (JP);
Masaya Ohtsuka, Kobe (JP); Ryuta Isobe, Ikeda (JP)

(73) Assignee: Ricoh Company, Ltd., Tokyo (JP)

( * ) Notice: Subject to any disclaimer, the term of this patent is extended or adjusted under 35 U.S.C. 154(b) by 79 days.

(21) Appl. No.: 12/840,872

(22) Filed: Jul. 21, 2010

(65) Prior Publication Data

US 2011/0018092 A1    Jan. 27, 2011

(30) Foreign Application Priority Data

Jul. 22, 2009    (JP) .................................. 2009-170762

(51) Int. Cl.
*H01L 23/52* (2006.01)

(52) U.S. Cl.
USPC ................... 257/529; 257/538; 257/E21.004; 438/132; 438/215; 438/281

(58) Field of Classification Search ................... 257/529
See application file for complete search history.

(56) References Cited

U.S. PATENT DOCUMENTS

| | | | |
|---|---|---|---|
| 4,628,590 A * | 12/1986 | Udo et al. | 438/6 |
| 7,692,265 B2 * | 4/2010 | Takewaki et al. | 257/529 |
| 2002/0111004 A1 * | 8/2002 | Suzuki et al. | 438/601 |
| 2004/0140501 A1 * | 7/2004 | Kim | 257/328 |
| 2004/0150070 A1 * | 8/2004 | Okada et al. | 257/508 |
| 2009/0001507 A1 | 1/2009 | Ohtsuka | |

FOREIGN PATENT DOCUMENTS

JP    09017874 A  *  1/1997

\* cited by examiner

*Primary Examiner* — Ajay K Arora
(74) *Attorney, Agent, or Firm* — Cooper & Dunham LLP

(57) ABSTRACT

A semiconductor device includes a semiconductor substrate, a base insulating layer, a silicon fuse, a pair of silicon wires, a silicon guard ring, an insulation coating, a first interlayer insulating layer, a via guard ring, a metal guard ring, a final insulating layer, and a fuse window. The base insulating layer is disposed over the semiconductor substrate. The silicon fuse is disposed on the base insulating layer. The pair of silicon wires is disposed on the base insulating layer. The silicon guard ring is disposed on the base insulating layer. The insulation coating is deposited at least over surfaces of the silicon wires. The first interlayer insulating layer is disposed on the base insulating layer. The final insulating layer is disposed on the interlayer insulating layer. The fuse window is defined above the silicon fuse inside the guard rings.

8 Claims, 11 Drawing Sheets

SEMICONDUCTOR DEVICE WITH A FUSE

BACKGROUND OF THE INVENTION

1. Technical Field

The present invention relates to a semiconductor device, and more particularly, to a multilayer semiconductor device incorporating an electrical fuse with a fuse window defined in a superjacent insulating layer to allow access with relatively thin insulation therethrough, in which a generally ring-shaped guard ring surrounds the fuse and its adjacent area to prevent contaminants from entering internal circuitry through the fuse window.

2. Discussion of the Background

Electrical fuses are employed in various semiconductor devices to provide redundant circuits and programmable memory, as well as adjustable resistance for setting up a desired voltage. One particular type of electrical fuse is a silicon fuse formed of a patterned layer of polysilicon deposited over a semiconductor substrate on which an integrated circuit (IC) is constructed. As an IC chip typically has a multilayered structure wherein various components and wires are layered one atop another with one or more layers of insulating material interposed therebetween, a silicon fuse has a window defined in its superjacent insulating layers to allow blowing or cutting off of the fuse, for example, through laser irradiation, during configuration of the semiconductor device.

One problem encountered by such an electrical fuse is that the fuse window allows moisture and other contaminants to enter into the insulation layers, which are relatively permeable to water, to reach wiring and circuit components inside the multilayered structure. Not surprisingly, this affects characteristics and performance of the internal circuitry and eventually reduces reliability of the IC chip.

To address this problem, a typical approach is to provide a generally ring-shaped guard ring of impervious material that surrounds the fuse and fuse window to prevent penetration of foreign matter into the internal circuitry.

Figure 1:
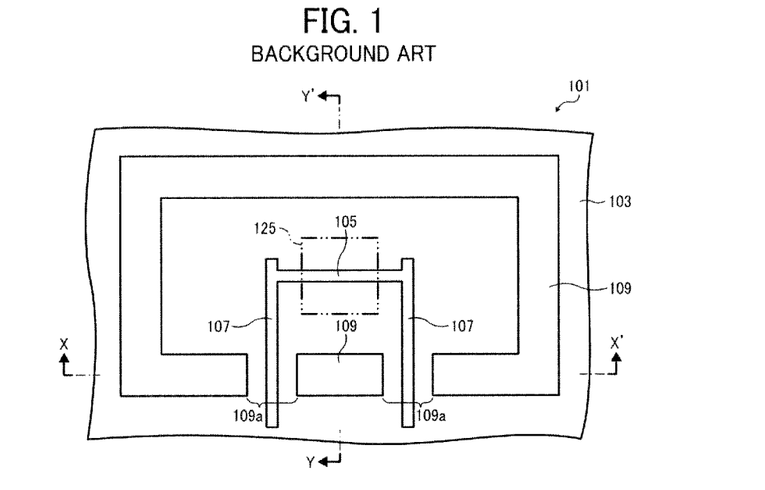
FIG. 1 is a plan view schematically illustrating a conventional semiconductor device.
Figure 2:
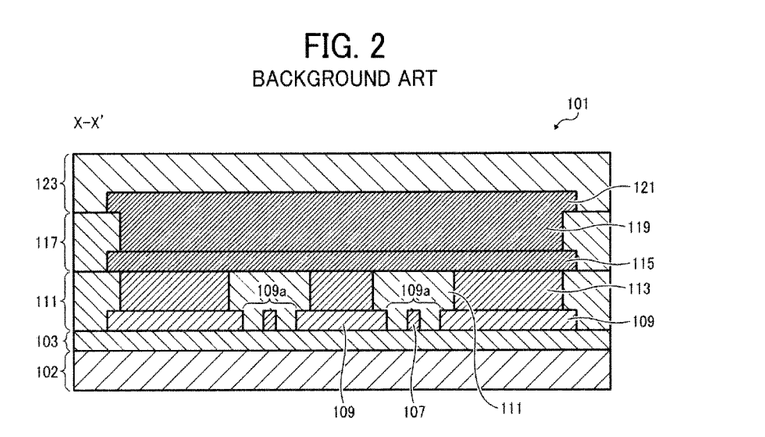
FIG. 2 is a cross sectional view of the semiconductor device taken along lines X-X' of FIG. 1.
Figure 3:
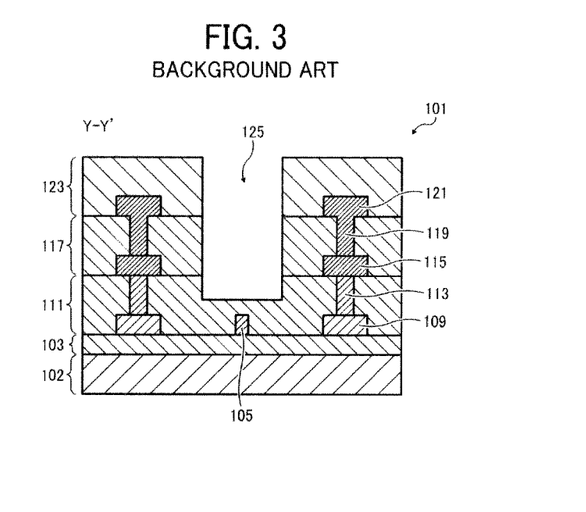
FIG. 3 is a cross sectional view of the semiconductor device taken along lines Y-Y' of FIG. 1.

FIG. 1 is a plan view schematically illustrating a conventional semiconductor device 101, shown with several components omitted for clarity, and FIGS. 2 and 3 are cross-sectional views of the semiconductor device 101 taken along lines X-X' and Y-Y', respectively, of FIG. 1.

As shown in FIGS. 1 through 3, the semiconductor device 101 is built on a substrate 102 of semiconductor material covered by a base insulating layer 103 for insulation.

On the base insulating layer 103 are a fuse or fusible link 105 with a pair of wires 107 each extending from one end of the fuse 105, as well as a generally ring-shaped guard ring 109 surrounding the fuse 105 and its adjacent area, all formed of silicon deposited and patterned over the base insulating layer 103. The silicon guard ring 109 is partially open with a pair of notches 109a cut in one side thereof to allow the wires 107 to extend from inside to outside the guard ring 109 without contacting, hence in electrical isolation from, the guard ring 109.

On the base insulating layer 103, a first interlayer insulating layer 111 covers the surfaces of the fuse 105 and the wires 107 as well as the surfaces of the guard ring 109 for electrically isolating the silicon layers from metal wiring.

The first interlayer insulating layer 111 has a contact hole defined above and along the silicon guard ring 109, which is filled with metal to form a generally ring-shaped first via guard ring 113 within the interlayer insulating layer 111, which surrounds, in plan view, the silicon fuse 105 and its adjacent area. Similar to the silicon guard ring 109, the first via guard ring 113 is partially open above the pair of notches 109a cut on one side of the subjacent guard ring 109 to allow the wires 107 to extend from inside to outside the guard ring 113 without contacting, hence in electrical isolation from, the guard ring 113.

Above the first interlayer insulating layer 111 is a generally rectangular ring-shaped, closed first metal guard ring 115 formed of metal deposited above and along the first via guard ring 111, which surrounds, in plan view, the silicon fuse 105 and its adjacent area.

Disposed on the first interlayer insulating layer 111 is a second interlayer insulating layer 117 for electrically isolating metal wires from each other, which covers the surfaces of the first metal guard ring 115. The second interlayer insulating layer 117 has a via hole defined above and along the first metal guard ring 115, which is filled with metal to form a generally rectangular ring-shaped, closed second via guard ring 119 within the second interlayer insulating layer 117, which surrounds, in plan view, the silicon fuse 105 and its adjacent area.

Above the second interlayer insulating layer 117 is a generally rectangular ring-shaped, closed second metal guard ring 121 formed of metal deposited on and along the second via guard ring 119, which surrounds, in plan view, the silicon fuse 105 and its adjacent area.

Finally, the semiconductor device 101 is topped by a final passivation or insulating layer 123 disposed on the second interlayer insulating layer 117 to cover the surfaces of the second metal guard ring 121.

The semiconductor device 101 has a fuse window 125 defined in the insulating layers 111, 117, and 123, wherein either no insulating layer or an insulating layer thinner than that at the other portions is disposed above the silicon fuse 105 to provide access to the silicon fuse 105 with relatively thin insulation therethrough. The layered guard rings 109, 113, 115, 119, and 121 surrounding the fuse 105, and hence surrounding the fuse window 125 disposed thereabove as well, serve to prevent atmospheric moisture and other contaminants from penetrating into the permeable insulating layers through the fuse window 125, and eventually into the internal circuitry.

Although providing substantially greater protection against contamination than a configuration without guard rings, the semiconductor device 101 with the multilayered guard rings still has a risk of leaking foreign matter into the internal circuitry. As mentioned, the conventional device 101 has the guard rings 109 and 113, immediately adjacent to the silicon wires 107, partially open to allow the wires 107 to extend outward from the fuse 105 in electrical isolation from the guard rings. Unfortunately, this partial opening leaves a path for contaminants to break through the guard rings to reach the internal circuitry, making the conventional semiconductor device 101 less reliable than would otherwise be expected.

BRIEF SUMMARY

This disclosure describes an improved semiconductor device having a silicon fuse with a fuse window defined thereabove in an insulating layer.

In one aspect of the disclosure, the improved semiconductor device includes a semiconductor substrate, a base insulating layer, a silicon fuse, a pair of silicon wires, a generally ring-shaped, closed silicon guard ring, an insulation coating, a first interlayer insulating layer, a generally ring-shaped, closed via guard ring, a generally ring-shaped, closed metal guard ring, a final insulating layer, and a fuse window. The base insulating layer is disposed over the semiconductor substrate for insulation. The silicon fuse is disposed on the base insulating layer. The pair of silicon wires is disposed on the base insulating layer, each extending from one end of the silicon fuse. The silicon guard ring is disposed on the base insulating layer to surround, in plan view, the silicon fuse, while overlapping the silicon wires at points where the silicon wires extend beyond the silicon guard ring. The silicon fuse and the silicon wires are formed of a first patterned silicon layer deposited on the base insulating layer. The silicon guard ring is formed of a second patterned silicon layer, different from the first patterned silicon layer, deposited on the base insulating layer. The insulation coating is deposited at least over surfaces of the silicon wires to electrically isolate the silicon wires from the silicon guard ring at the points of overlap. The first interlayer insulating layer is thicker than the insulation coating, and is disposed on the base insulating layer to cover the silicon fuse, the silicon wires, and the silicon guard ring for insulation. The via guard ring is formed of metal filling a via hole defined in the interlayer insulating layer on and along the silicon guard ring to surround, in plan view, the silicon fuse. The metal guard ring is formed of metal deposited above the interlayer insulating layer on and along the via guard ring to surround, in plan view, the silicon fuse. The final insulating layer is disposed on the interlayer insulating layer to cover the metal guard ring for insulation. The fuse window is defined in at least one of the insulating layers above the silicon fuse inside the guard rings to provide access to the silicon fuse with relatively thin insulation therethrough.

This disclosure also describes an improved semiconductor device with a metal fuse with a fuse window defined thereabove in an insulating layer.

In one aspect of the disclosure, the semiconductor device includes a semiconductor substrate, a base insulating layer, an interlayer insulating layer, a metal fuse, a pair of silicon wires, a generally ring-shaped, closed silicon guard ring, an insulation coating, a generally ring-shaped, closed via guard ring, a generally ring-shaped, closed metal guard ring, a final insulating layer, and a fuse window. The base insulating layer is disposed over the semiconductor substrate for insulation. The interlayer insulating layer is disposed above the base insulating layer for insulation. The metal fuse is disposed on the interlayer insulating layer. The pair of silicon wires are disposed on the base insulating layer below the interlayer insulting layer, each connected to one end of the metal fuse through a via penetrating the interlayer insulating layer. The silicon guard ring is disposed on the base insulating layer to surround, in plan view, the metal fuse, while overlapping the silicon wires at points where the silicon wires extend beyond the silicon guard ring. The silicon wires are formed of a first patterned silicon layer deposited on the base insulating layer. The silicon guard ring is formed of a second patterned silicon layer, different from the first patterned silicon layer, deposited on the base insulating layer. The insulation coating is deposited at least over surfaces of the silicon wires to electrically isolate the silicon wires from the silicon guard ring at the points of overlap. The via guard ring is formed of metal filling a via hole defined in the interlayer insulating layer on and along the silicon guard ring to surround, in plan view, the metal fuse. The metal guard ring is formed of metal deposited above the interlayer insulating layer on and along the via guard ring to surround, in plan view, the metal fuse. The final insulating layer is disposed on the interlayer insulating layer to cover the metal guard ring for insulation. The fuse window is defined in at least the final insulating layer above the metal fuse inside the guard rings to provide access to the metal fuse with relatively thin insulation therethrough.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF EXEMPLARY EMBODIMENTS

In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, examples and exemplary embodiments of this disclosure are described.

Figure 4:
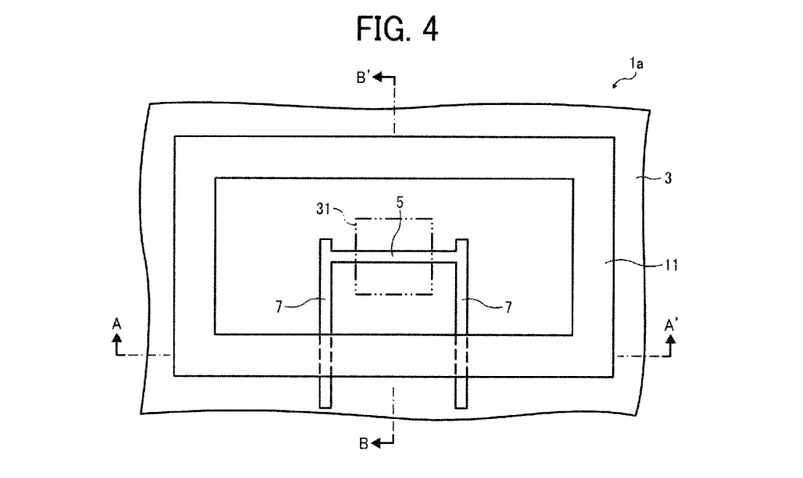
FIG. 4 is a plan view schematically illustrating a semiconductor device according to a first embodiment of this patent specification.
Figure 5:
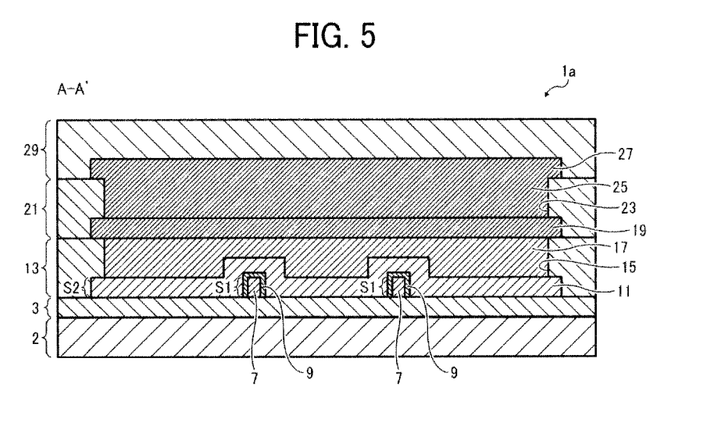
FIG. 5 is a cross sectional view of the semiconductor device taken along lines A-A' of FIG. 4.
Figure 6:
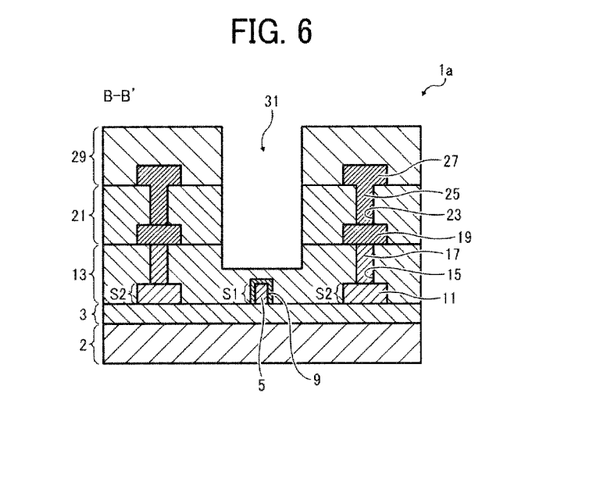
FIG. 6 is a cross sectional view of the semiconductor device taken along lines B-B' of FIG. 4.

FIG. 4 is a plan view schematically illustrating a semiconductor device 1a according to a first embodiment of this patent specification, shown with several components omitted for clarity, and FIGS. 5 and 6 are cross-sectional views of the semiconductor device 1a taken along lines A-A' and B-B', respectively, of FIG. 4.

As shown in FIGS. 4 through 6, the semiconductor device 1a is built on a substrate 2 of semiconductor material, which is covered by a base insulating layer 3 for insulation, formed using a known insulation process such as local oxidation of silicon (LOCOS).

First, on the base insulating layer 3 lies a silicon fuse or fusible link 5 with a pair of silicon wires 7 each extending from one end of the fuse 5. The silicon fuse 5 and the silicon wires 7 are all formed of a first silicon layer S1, such as a layer of polysilicon approximately 0.1 to approximately 0.5 micrometers (μm) thick, patterned into a generally Π-shaped configuration.

Also on the base insulating layer 3 is a generally rectangular ring-shaped, closed silicon guard ring 11 that completely surrounds, in plan view, the silicon fuse 5 and its adjacent area, while overlapping the silicon wires 7 at points where the wires 7 extend beyond the guard ring 11. The silicon guard ring 11 is formed of a second silicon layer S2, such as a layer of polysilicon approximately 0.1 to approximately 0.5 μm thick, patterned into a substantially annular configuration.

The first and second silicon layers S2 are two different layers deposited separately on the base insulating layer 3, each having a particular thickness and a particular resistivity specific to the material. Thus, the thicknesses of the layers S1 and S2 may be identical to or different from each other, and the resistivities of the layers S1 and S2 may be identical to or different from each other.

The silicon fuse 5 and the silicon wires 7 have their respective surfaces coated with a coating 9 of insulating material, such as silicon oxide, silicon nitride, or a combination of both, which serves to electrically isolate the silicon wires 7 from the silicon guard ring 11 at the points of overlap.

Specifically, the insulation coating 9 may comprise a film of silicon oxide, in particular, that of high-temperature oxide (HTO), approximately 0.05 to approximately 0.2 μm thick, formed by oxidizing the respective surfaces of the fuse 5 and the wires 7 after patterning the first silicon layer S1. Alternatively, the insulation coating 9 may comprise a film of silicon nitride approximately 0.05 to approximately 0.2 μm thick, formed by depositing silicon nitride to a desired thickness through low pressure chemical vapor deposition (LPCVD) over the first silicon layer S1 after patterning, followed by patterning the obtained silicon nitride layer into a desired configuration to leave the silicon nitride deposits on the surfaces of the fuse 5 and the wires 7. Alternatively still, the insulation coating 9 may comprise a laminated layer of silicon oxide and silicon nitride, wherein an upper silicon nitride layer overlies a lower silicon oxide film covering the respective surfaces of the fuse 5 and the wires 9.

Then, on the base insulating layer 3, a first interlayer insulating layer 13 covers the coated surfaces of the fuse 5 and the wires 7 as well as the surfaces of the guard ring 11 for electrically isolating the silicon layers from metal wiring. The first interlayer insulating layer 13 may comprise a layer of silicon oxide (e.g., borophosphosilicate or BPSG glass in the present embodiment), deposited thicker than the insulation coating 9, such as approximately 0.5 to approximately 1.0 μm thick, over the base insulating layer 3.

The first interlayer insulating layer 13 has a moat-like contact hole 15 defined above and along the silicon guard ring 11. The contact hole 15 is filled with metal such as tungsten to form a generally rectangular ring-shaped, closed first via guard ring 17 within the interlayer insulating layer 13, which completely surrounds, in plan view, the silicon fuse 5 and its adjacent area.

Above the first interlayer insulating layer 13 is a generally rectangular ring-shaped, closed first metal guard ring 19 formed of metal such as aluminum deposited, for example, approximately 0.5 to approximately 1.0 μm thick, on and along the first via guard ring 17, which completely surrounds, in plan view, the silicon fuse 5 and its adjacent area.

Disposed on the first interlayer insulating layer 13 is a second interlayer insulating layer 21 for electrically isolating metal wires from each other, which covers the surfaces of the first metal guard ring 19. The second interlayer insulating layer 21 has a moat-like via hole 23 defined above and along the first metal guard ring 19. The via hole 23 is filled with metal such as aluminum to form a generally rectangular ring-shaped, closed second via guard ring 25 within the second interlayer insulating layer 21, which completely surrounds, in plan view, the silicon fuse 5 and its adjacent area.

Above the second interlayer insulating layer 21 is a generally rectangular ring-shaped, closed second metal guard ring 27 formed of metal such as aluminum deposited on and along the second via guard ring 25, which completely surrounds, in plan view, the silicon fuse 5 and its adjacent area.

In the present embodiment, the second via guard ring 25 and the second metal guard ring 27 are integrally formed of a single material such as aluminum, deposited, for example, approximately 0.5 to approximately 1.0 μm thick above the first metal guard ring 19. Alternatively, instead, these guard rings 25 and 27 may be formed through separate processes using different materials.

Finally, the semiconductor device 1a is topped by a final passivation or insulating layer 29 disposed on the second interlayer insulating layer 21 to cover the surfaces of the second metal guard ring 27. The final passivation layer 29 may comprise a layer of silicon nitride or a laminated layer of silicon oxide and silicon nitride.

The semiconductor device 1a has a fuse window 31 defined in at least one of the insulating layers 13, 21, and 29 inside the layered guard rings 11, 17, 19, 25, and 27, wherein no insulating layer or an insulating layer thinner than that at the other portions is disposed above the silicon fuse 5 to provide access to the silicon fuse 5 with relatively thin insulation therethrough. The fuse window 31 is defined by removing or etching away those portions of the insulating layers above and around the silicon fuse 5 to an extent depending on the specific configuration of the semiconductor device 1.

For example, the fuse window 31 may comprise a substantially vertical hole penetrating completely the passivation layer 29 and the second interlayer insulating layer 21 and terminating in the first interlayer insulating layer 13 without reaching the upper surface of the silicon fuse 5, as shown in FIG. 6.

Alternatively, instead, the fuse window 31 may comprise a substantially vertical hole penetrating completely the passivation layer 29, the second interlayer insulating layer 21, and the first interlayer insulating layer 13 to expose the surface of the base insulating layer 3. In such cases, the silicon fuse 5 may have its bare surfaces exposed through the fuse window 31, where the insulation coating 9 is formed of silicon oxide which is removed together with the adjoining insulating layer during etching, or kept unexposed under the insulation coating 9, where the insulation coating 9 is formed of nitride oxide which persists to protect the fuse 5 during etching.

Although not depicted in FIGS. 4 through 6, the semiconductor device 1a has various electrical components, such as transistors, capacitors, resistors, etc., disposed on the semiconductor substrate 2 and the base insulating layer 3 to form internal circuitry adjoining the silicon fuse 5, with vias and metal wires formed simultaneously with the via guard rings 17 and 25 and the metal guard rings 19 and 27 to provide electrical connections among the circuit components.

In such a configuration, the semiconductor device 1a according to this patent specification is highly immune to leaking atmospheric moisture and other contaminants (i.e., foreign matter that can enter the fuse window 31 and penetrate through the insulating layers) into the internal circuitry. That is, the silicon guard ring 11, the first via guard ring 17, the first metal guard ring 19, the second via guard ring 25, and the second metal guard ring 27, which are all formed in a closed configuration and layered one atop another, together form a sealing structure that encloses the silicon fuse 5 as well as the fuse window 31 disposed above the fuse 5, so that there is substantially no pathway for contaminants to leak into the internal circuitry through the interlayer insulating layers, except for a very limited zone in which the insulation coating 9 extends between the adjoining surfaces of the silicon wire 7 and the silicon guard ring 11.

Compared to a conventional configuration where the guard ring is partially open to allow wiring of an electrical fuse outward from the guard ring, the effective use of the insulation coating 9 allows the guard ring 11 to overlap the silicon wires 7 in electrical isolation, which enables the closed configuration of the guard ring to provide tight protection against leaking contaminants. Moreover, compared to spatially separating the wires from the guard ring, which can require extra space for accommodating process inconsistencies, using the insulation coating 9 for insulation results in a compact configuration of the semiconductor device 1a according to this patent specification.

In addition, forming the insulation coating 9 by oxidizing the surfaces of the silicon wires 7 ensures effective protection against leaking contaminants, as an oxidized silicon surface has a closely packed structure compared to that of a silicon oxide deposit (of which the interlayer insulating layer 13 is formed in the embodiment depicted above). A similar effect is obtained where the insulation coating 9 is formed of silicon oxide grown through an HTO process, or where the insulating coating 9 comprises a patterned layer of silicon nitride, since such layers have closely packed structures compared to that of deposited silicon oxide.

Although the embodiment above describes the semiconductor device 1a with the insulation coating 9 disposed on the entire surfaces of the silicon fuse 5 and the silicon wires 7, the extent to which the insulation coating 9 is provided may vary as long as it covers those portions of the silicon wires 7 immediately below the silicon guard ring 11 at the points of overlap.

For example, it is possible that the insulation coating 9 is not provided on the silicon fuse 5 in the embodiment described above. Further, where the insulation coating 9 comprises a silicon nitride layer or a combination of silicon oxide and silicon nitride layers, it is possible that the silicon nitride layer forming the insulation coating 9 extends over the surface of the base insulating layer 3 to underlie the silicon guard ring 11, as described below with reference to FIGS. 7 through 9.

Figure 7:
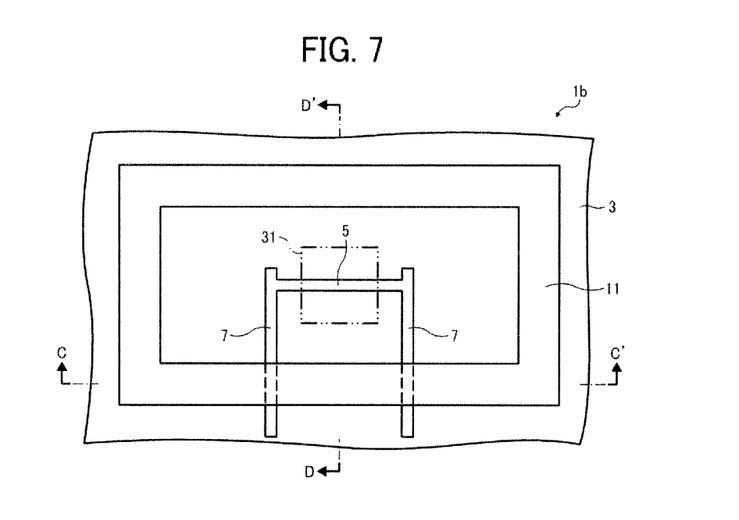
FIG. 7 is a plan view schematically illustrating a semiconductor device according to a second embodiment of this patent specification.
Figure 8:
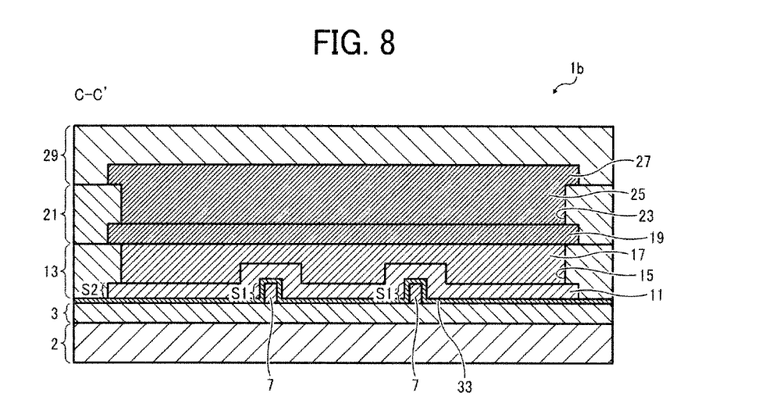
FIG. 8 is a cross sectional view of the semiconductor device taken along lines C-C' of FIG. 7.
Figure 9:
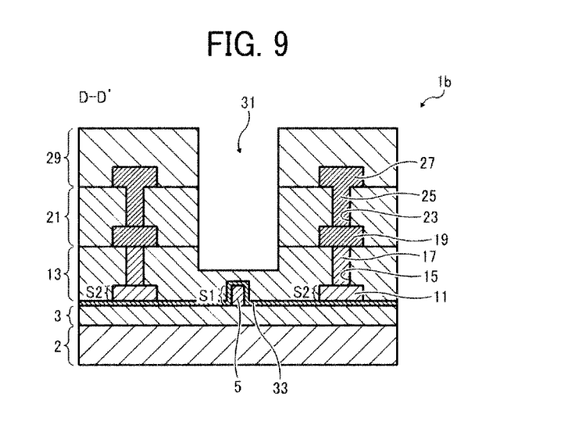
FIG. 9 is a cross sectional view of the semiconductor device taken along lines D-D' of FIG. 7.

FIG. 7 is a plan view schematically illustrating a semiconductor device 1b according to a second embodiment of this patent specification, shown with several components omitted for clarity, and FIGS. 8 and 9 are cross-sectional views of the semiconductor device 1b taken along lines C-C' and D-D', respectively, of FIG. 7.

As shown in FIGS. 7 through 9, the semiconductor device 1b is similar to the first embodiment described above, including the silicon fuse 5 and the silicon wires 7 disposed above the semiconductor substrate 2 covered with the base insulating layer 3, with the closed silicon guard ring 11, together with the superjacent guard rings 17, 19, 25, and 27, forming a sealing structure to prevent leakage from the fuse window 31 defined above the silicon fuse 5 in the insulating layers 13, 21, and 29. Unlike the first embodiment, the present embodiment uses a silicon nitride-based insulating layer 33, instead of the silicon oxide insulation coating 9, for insulation of the silicon wires 7, which covers the surface of the base insulating layer 3 in addition to those of the silicon fuse 5 and the silicon wires 7.

Specifically, the insulating layer 33 comprises a layer of silicon nitride, for example, approximately 0.05 to approximately 0.2 µm thick, that extends over the respective surfaces of the silicon fuse 5 and the silicon wires 7 as well as those of the base insulating layer 3 at least in a closed region defined within and beneath the silicon guard ring 11.

The insulating layer 33 may be formed by depositing silicon nitride over the base insulating layer 3 without patterning the silicon nitride deposit, in which case the insulating layer 33 extends over the entire surface of the base insulating layer 3, as in the embodiment depicted in FIGS. 7 through 9. Alternatively, instead, deposition of silicon nitride may be followed by patterning the obtained silicon nitride layer so that the insulating layer 33 is present only over the limited area within and beneath the silicon guard ring 11. Forming the insulating layer 33 without patterning is efficient in terms of the number of processes involved in the fabrication of the semiconductor device.

Further, the insulating layer 33 may be formed of a combination of a lower, silicon oxide layer and an upper, silicon nitride layer, in which case the respective surfaces of the silicon fuse 5 and the silicon wires 7 are coated first by the silicon oxide layer, and then by the silicon nitride layer.

In such a configuration, the semiconductor device 1b according to this patent specification is highly immune to leaking atmospheric moisture and other contaminants into the internal circuitry through the interlayer insulating layers, owing to the multilayered guard rings having a closed configuration to enclose the fuse 5 and the fuse window 31, as in the embodiment depicted in FIGS. 4 through 6.

Moreover, in addition to being able to prevent leakage through the interlayer insulating layers, the semiconductor device 1b provided with the silicon nitride-based insulating layer 33 over the base insulating layer 3 can prevent moisture and other contaminants leaking into the internal circuitry through the base insulating layer 3, resulting in enhanced immunity to leaking contaminants from the fuse window 31.

Figure 10:
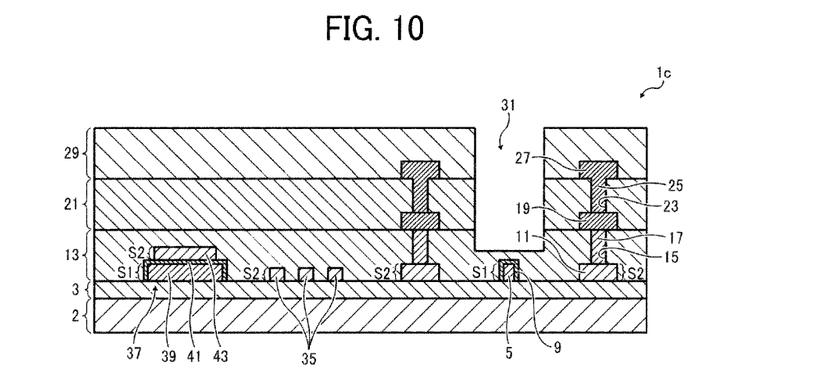
FIG. 10 is a schematic view illustrating in cross section a semiconductor device according to a third embodiment of this patent specification.

FIG. 10 is a schematic view illustrating in cross section a semiconductor device 1c according to a third embodiment of this patent specification.

As shown in FIG. 10, the semiconductor device 1c is similar to that depicted in the first embodiment, including the silicon fuse 5 and the silicon wires 7 disposed above the semiconductor substrate 2 covered with the base insulating layer 3, with the closed silicon guard ring 11, together with the superjacent guard rings 17, 19, 25, and 27, forming a sealing structure to prevent leakage from the fuse window 31 defined above the silicon fuse 5 in the insulating layers 13, 21, and 29. Unlike the first embodiment, the present embodiment includes a resistor 35 and a capacitor 37 disposed on the base insulating layer 3 outside and away from the silicon guard ring 11.

Specifically, the resistor 35 consists of a strip of polysilicon, which is obtained simultaneously with the silicon guard ring 11 by patterning the second silicon layer S2 disposed on the base insulating layer 3.

The capacitor 37 consists of a pair of first and second polysilicon electrodes 39 and 43 with a dielectric film 41 sandwiched therebetween. The first electrode 39 is formed simultaneously with the silicon fuse 5 by patterning the first silicon layer S1 disposed on the base insulating layer 3. The dielectric film 41 comprises a coating of silicon oxide or silicon nitride over the first electrode 39, obtained simultaneously with the insulation coating 9 covering the silicon wires 5. The second electrode 43 is formed simultaneously with the silicon guard ring 11 and the resistors 35 by patterning the second silicon layer S2 over the dielectric film 41.

In the present embodiment, the second silicon layer S2 forming the resistor 35 is thinner than the first silicon layer S1. This allows for production of the resistor 35 with relatively high resistance where the silicon layers are of heavily doped materials. Alternatively, instead, it is possible that the second silicon layer S2 has a thickness greater than or equal to that of the first silicon layer S1, and the resistor 35 be formed of the first silicon layer S1 instead of the second silicon layer S2, according to the intended application of the semiconductor device.

Further, although the present embodiment depicts the dielectric film 41 formed simultaneously with the oxidized silicon insulation coating 9, it is also possible to form the dielectric film 41 simultaneous with the nitride oxide-based insulation layer 33, as in the embodiment depicted with reference to FIGS. 7 through 9.

Figure 11:
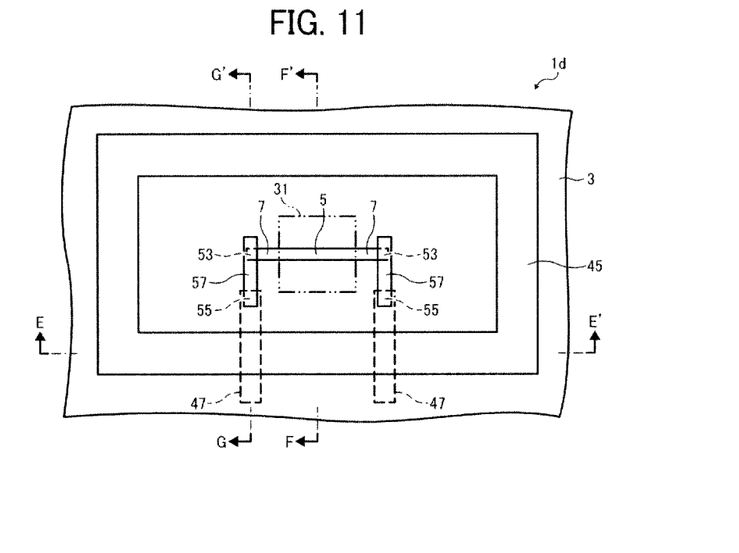
FIG. 11 is a plan view schematically illustrating a semiconductor device according to a fourth embodiment of this patent specification.
Figure 12:
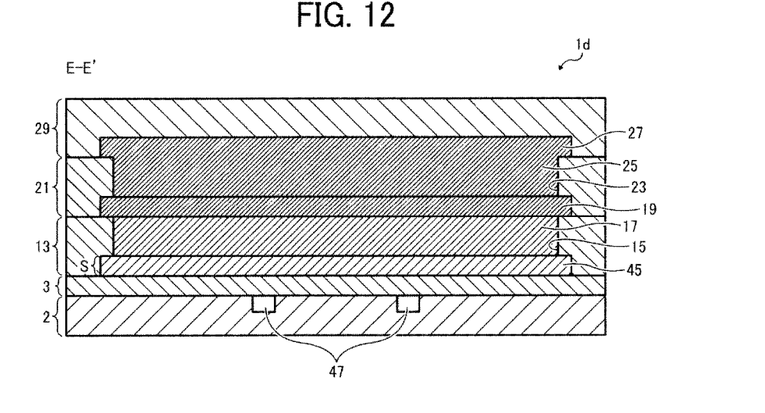
FIG. 12 is a cross sectional view of the semiconductor device taken along lines E-E' of FIG. 11.
Figure 13:
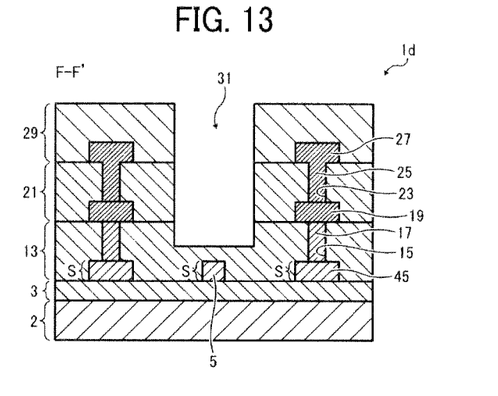
FIG. 13 is a cross sectional view of the semiconductor device taken along lines F-F' of FIG. 11.
Figure 14:
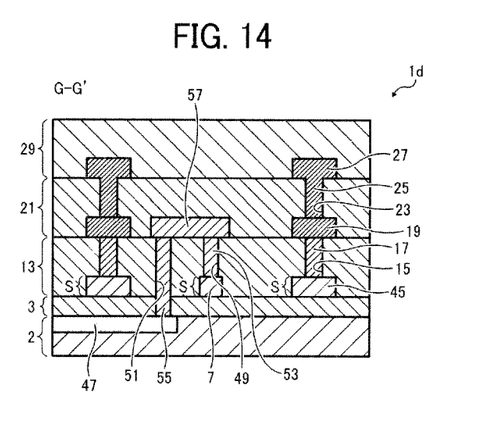
FIG. 14 is a cross sectional view of the semiconductor device taken along lines G-G' of FIG. 11.

FIG. 11 is a plan view schematically illustrating a semiconductor device 1d according to a fourth embodiment of this patent specification, shown with several components omitted for clarity, and FIGS. 12, 13 and 14 are cross-sectional views of the semiconductor device 1d taken along lines E-E', F-F', and G-G', respectively, of FIG. 11.

As shown in FIGS. 11 through 14, the semiconductor device 1d is built on a substrate 2 of semiconductor material covered by a base insulating layer 3 for insulation. The semiconductor substrate 2 has a pair of buried wires 47 formed by introducing dopant through diffusion beneath the substrate surface.

On the base insulating layer 3 lies a silicon fuse or fusible link 5 with a pair of silicon wires 7 each extending from one end of the fuse 5, as well as a generally rectangular ring-shaped, closed silicon guard ring 45 that completely surrounds, in plan view, the silicon fuse 5 and its adjacent area, while crossing over the buried wires 47 where the wires 47 extend beyond the guard ring 45. The silicon fuse 5, the silicon wires 7, and the silicon guard ring 45 are all formed of a single patterned silicon layer S.

On the base insulating layer 3, a first interlayer insulating layer 13 covers the respective surfaces of the fuse 5 and the wires 7 as well as the surfaces of the silicon guard ring 45 for electrically isolating the silicon layer from metal wiring.

The first interlayer insulating layer 13 has a moat-like contact hole 15 defined above and along the silicon guard ring 11. The contact hole 15 is filled with metal to form a generally rectangular ring-shaped, closed first via guard ring 17 within the interlayer insulating layer 13, which completely surrounds, in plan view, the silicon fuse 5 and its adjacent area.

The first interlayer insulting layer 13 also has two pairs of symmetrically disposed contact holes 49 and 51. The contact holes 49 are bored through the first interlayer insulating layer 13, one above one of the paired silicon wires 7, which are filled with metal to form a pair of first interlayer vias 53 penetrating the interlayer insulating layer 13. Similarly, the contact holes 51 are bored through the thicknesses of the interlayer insulating layer 13 and the base insulating layer 3, one above one of the paired buried wires 47, which are filled with metal to form a pair of second interlayer vias 55 penetrating the insulating layers 3 and 13. The first and second interlayer vias 53 and 55 are formed simultaneously with the first via guard ring 17.

Above the first interlayer insulating layer 13 is a generally rectangular ring-shaped, closed first metal guard ring 19 formed of metal deposited on and along the first via guard ring 17, which completely surrounds, in plan view, the silicon fuse 5 and its adjacent area. Also above the first interlayer insulating layer 13 lie a pair of symmetrically disposed, first metal wires 57, each extending within the first via guard ring 17 with one end connecting to the silicon wire 7 through the interlayer via 53 and another, opposite end connecting to the buried wire 47 through the interlayer via 51. The first metal wires 57 are formed simultaneously with the first metal guard ring 19.

With the wiring provided within and across the insulating layers, the silicon fuse 5 has each end electrically connected first to the silicon wire 7, then to the metal wire 57 through the interlayer via 53, and then to the buried wire 47 through the interlayer via 55, which eventually conducts voltage to the circuitry outside the guard rings used in conjunction with the fuse 5.

Disposed on the first interlayer insulating layer 13 is a second interlayer insulating layer 21 for electrically isolating metal wires from each other, which covers the surfaces of the first metal guard ring 19 and the first metal wires 57. The second interlayer insulating layer 21 has a via hole 23 defined above and along the first metal guard ring 19. The via hole 23 is filled with metal to form a generally rectangular ring-shaped, closed second via guard ring 25 within the second interlayer insulating layer 21, which completely surrounds, in plan view, the silicon fuse 5 and its adjacent area.

Above the second interlayer insulating layer 21 is a generally rectangular ring-shaped, closed second metal guard ring 27 formed of metal deposited on and along the second via guard ring 25, which completely surrounds, in plan view, the silicon fuse 5 and its adjacent area.

Finally, the semiconductor device 1d is topped by a final passivation or insulating layer 29 disposed on the second interlayer insulating layer 21 to cover the surfaces of the second metal guard ring 27.

The semiconductor device 1d has a fuse window 31 defined in at least one of the insulating layers 13, 21, and 29 inside the layered guard rings 45, 17, 19, 25, and 27, wherein no insulating layer or an insulating layer thinner than that at the other portions is disposed above the silicon fuse 5 to provide access to the silicon fuse 5 with relatively thin insulation therethrough.

In such a configuration, the semiconductor device 1d according to this patent specification is highly immune to leaking atmospheric moisture and other contaminants into the internal circuitry. That is, the silicon guard ring 45, the first via guard ring 17, the first metal guard ring 19, the second via guard ring 25, and the second metal guard ring 27, which are all formed in a closed configuration and layered one atop another, together form a sealing structure that encloses the silicon fuse 5 as well as the fuse window 31 disposed above the fuse 5, so that there is substantially no pathway for contaminants to leak into the internal circuitry through the interlayer insulating layers.

Compared to a conventional configuration where the guard ring is partially open to allow wiring of an electrical fuse outward from the guard ring, the use of the buried wires 47, which can carry voltage from inside to outside the guard ring 45 in isolation from the silicon guard ring 45, enables the closed configuration of the silicon guard ring 45 to provide tight protection against leaking contaminants.

Figure 15:
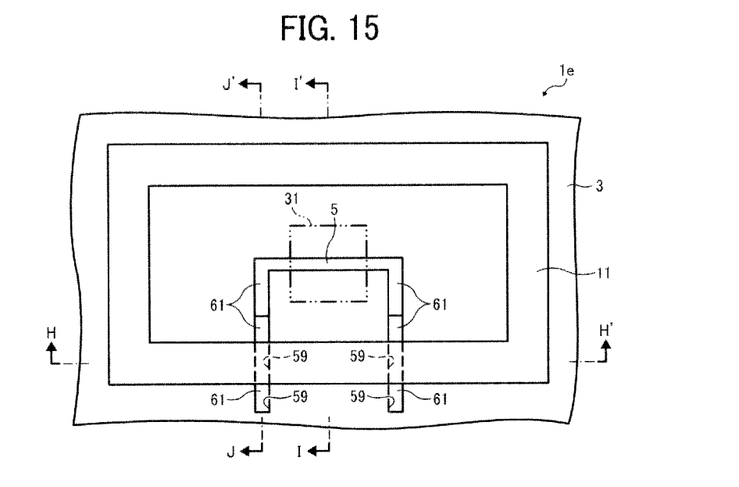
FIG. 15 is a plan view schematically illustrating a semiconductor device according to a fifth embodiment of this patent specification.
Figure 16:
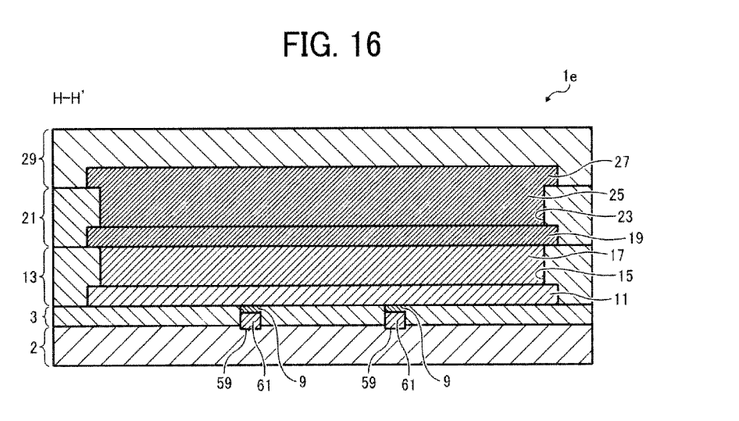
FIG. 16 is a cross sectional view of the semiconductor device taken along lines H-H' of FIG. 15.
Figure 17:
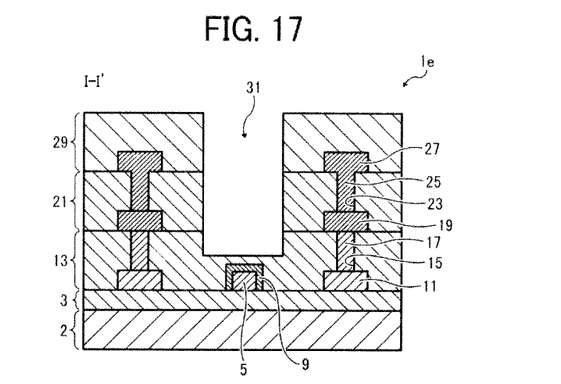
FIG. 17 is a cross sectional view of the semiconductor device taken along lines I-I' of FIG. 15.
Figure 18:
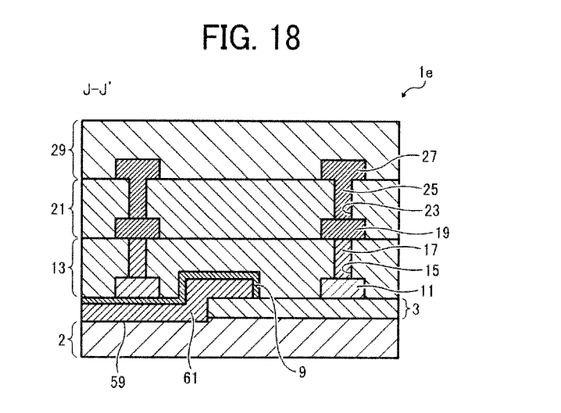
FIG. 18 is a cross sectional view of the semiconductor device taken along lines J-J' of FIG. 15.

FIG. 15 is a plan view schematically illustrating a semiconductor device 1e according to a fifth embodiment of this patent specification, shown with several components omitted for clarity, and FIGS. 16, 17, and 18 are cross-sectional views of the semiconductor device 1e taken along lines H-H', I-I', and J-J', respectively, of FIG. 15.

As shown in FIGS. 15 through 18, the semiconductor device 1d is built on a substrate 2 of semiconductor material covered by a base insulating layer 3 for insulation.

On the base insulating layer 3 lies a silicon fuse or fusible link 5 with a pair of partially buried, silicon wires 61 each extending from one end of the fuse 5. The silicon fuse 5 is formed of a first patterned silicon layer S1. The silicon wires 61 are formed of silicon disposed in a pair of symmetrically disposed trenches 59 each formed by removing portions of the semiconductor substrate 2 and the base insulating layer 3.

Also on the base insulating layer 3 is a generally rectangular ring-shaped, closed silicon guard ring 11 that completely surrounds, in plan view, the silicon fuse 5 and its adjacent area, while overlapping the silicon wires 61 at points where the wires 61 extend beyond the guard ring 11. The silicon guard ring 11 is formed of a second patterned silicon layer S2 different from the first patterned silicon layer S1.

The silicon fuse 5 and the silicon wires 61 have their respective surfaces coated with a coating 9 of insulating material, such as silicon oxide, silicon nitride, or a combination of both, which serves to electrically isolate the silicon wires 61 from the silicon guard ring 11 at the points of overlap.

On the base insulating layer 3, a first interlayer insulating layer 13 covers the coated surfaces of the fuse 5 and the wires 61 as well as the surfaces of the guard ring 11 for electrically isolating the silicon layers from metal wiring.

The first interlayer insulating layer 13 has a moat-like contact hole 15 defined above and along the silicon guard ring 11. The contact hole 15 is filled with metal to form a generally rectangular ring-shaped, closed first via guard ring 17 within the interlayer insulating layer 13, which completely surrounds, in plan view, the silicon fuse 5 and its adjacent area.

Above the first interlayer insulating layer 13 is a generally rectangular ring-shaped, closed first metal guard ring 19 formed of metal deposited on and along the first via guard ring 17, which completely surrounds, in plan view, the silicon fuse 5 and its adjacent area.

Disposed on the first interlayer insulating layer 13 is a second interlayer insulating layer 21 for electrically isolating metal wires from each other, which covers the surfaces of the first metal guard ring 19. The second interlayer insulating layer 21 has a via hole 23 defined above and along the first metal guard ring 19. The via hole 23 is filled with metal to form a generally rectangular ring-shaped, closed second via guard ring 25 within the second interlayer insulating layer 21, which completely surrounds, in plan view, the silicon fuse 5 and its adjacent area.

Above the second interlayer insulating layer 21 is a generally rectangular ring-shaped, closed second metal guard ring 27 formed of metal deposited on and along the second via guard ring 25, which completely surrounds, in plan view, the silicon fuse 5 and its adjacent area.

Finally, the semiconductor device 1e is topped by a final passivation or insulating layer 29 disposed on the second interlayer insulating layer 21 to cover the surfaces of the second metal guard ring 27.

The semiconductor device 1e has a fuse window 31 defined in at least one of the insulating layers 13, 21, and 29 inside the layered guard rings 11, 17, 19, 25, and 27, wherein no insulating layer or an insulating layer thinner than that at the other portions is disposed above the silicon fuse 5 to provide access to the silicon fuse 5 with relatively thin insulation therethrough.

In such a configuration, the semiconductor device 1e according to this patent specification is highly immune to leaking atmospheric moisture and other contaminants into the internal circuitry. That is, the silicon guard ring 11, the first via guard ring 17, the first metal guard ring 19, the second via guard ring 25, and the second metal guard ring 27, which are all formed in a closed configuration and layered one atop another, together form a sealing structure that encloses the silicon fuse 5 as well as the fuse window 31 disposed above the fuse 5, so that there is substantially no pathway for contaminants to leak into the internal circuitry through the interlayer insulating layers, except for a very limited zone in which the insulation coating 9 extends between the adjoining surfaces of the silicon wire 61 and the silicon guard ring 11.

In addition, forming the insulation coating 9 by oxidizing the surfaces of the silicon wires 7 ensures effective protection against leaking contaminants, as an oxidized silicon surface has a closely packed structure compared to that of a silicon oxide deposit (of which the interlayer insulating layer 13 is formed in the embodiment depicted above).

Although the embodiment above describes the semiconductor device 1e with the insulation coating 9 extending over the respective surfaces of the silicon fuse 5 and the silicon wires 61, the extent to which the insulating coating 9 is provided may vary as long as it covers those portions of the silicon wires 7 immediately below the silicon guard ring 11 at the points of overlap. For example, it is possible that the insulation coating 9 is not provided on the silicon fuse 5 in the embodiment described above.

Further, although the embodiment above describes the insulation coating 9 formed by oxidizing the respective surfaces of the silicon fuse 5 and the silicon wires 61, it is also possible to use a silicon nitride layer or a laminated layer of silicon oxide and silicon nitride as the insulation coating 9, similar to that used in the embodiment depicted primarily with reference to FIGS. 7 through 9.

Furthermore, although the embodiment above describes the trenches 59 formed by removing portions of the semiconductor substrate 2 and the base insulating layer 3, the trenches 59 may be obtained without cutting through the semiconductor substrate 2.

In further embodiment, the semiconductor device according to this patent specification may have the multilayered, closed guard ring structure arranged for use with a metal fuse, instead of a silicon fuse, that has a fuse window defined in superjacent insulating layers.

Figure 19:
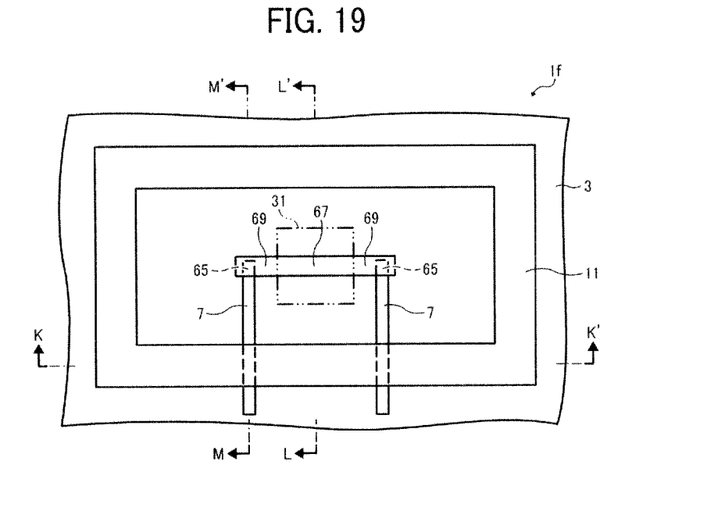
FIG. 19 is a plan view schematically illustrating a semiconductor device according to a sixth embodiment of this patent specification.
Figure 20:
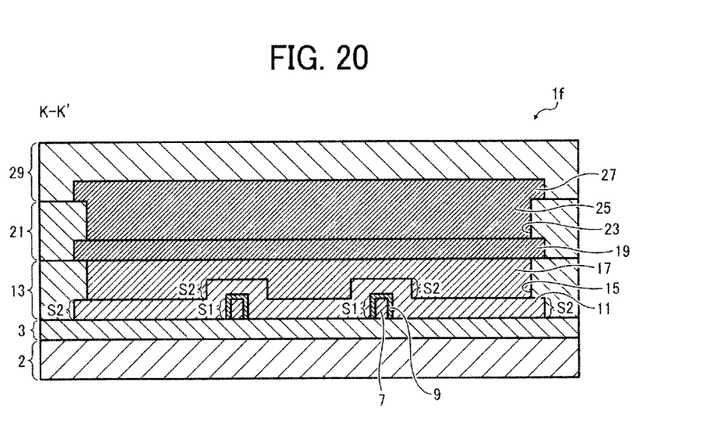
FIG. 20 is a cross sectional view of the semiconductor device taken along lines K-K' of FIG. 19.
Figure 21:
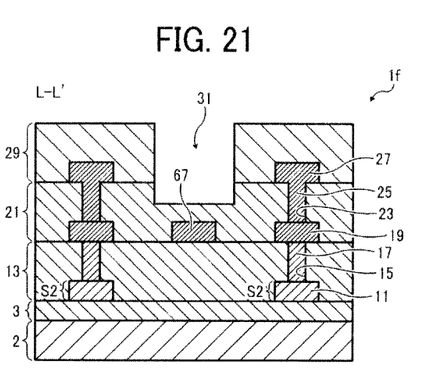
FIG. 21 is a cross sectional view of the semiconductor device taken along lines L-L' of FIG. 19.
Figure 22:
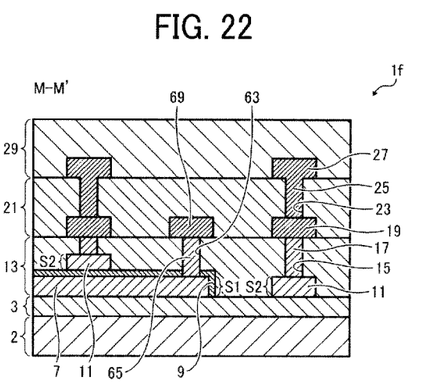
FIG. 22 is a cross sectional view of the semiconductor device taken along lines M-M' of FIG. 19.

FIG. 19 is a plan view schematically illustrating a semiconductor device 1f according to a sixth embodiment of this patent specification, shown with several components omitted for clarity, and FIGS. 20, 21, and 22 are cross-sectional views of the semiconductor device 1f taken along lines K-K', L-L', and M-M', respectively, of FIG. 19.

As shown in FIGS. 19 through 22, the semiconductor device 1*f* is built on a substrate 2 of semiconductor material covered by a base insulating layer 3 for insulation.

On the base insulating layer 3 lie a pair of silicon wires 7 formed of a first patterned silicon layer S1, as well as a generally rectangular ring-shaped, closed silicon guard ring 11 that overlaps the silicon wires 7 at points where the wires 7 extend beyond the guard ring 11. The silicon guard ring 11 is formed of a second patterned silicon layer S2, different from the first patterned silicon layer S1.

The silicon wires 7 have their respective surfaces coated with a coating 9 of insulating material, such as silicon oxide, silicon nitride, or a combination of both, which serves to electrically isolate the silicon wires 7 from the silicon guard ring 11 at the points of overlap.

On the base insulating layer 3, a first interlayer insulating layer 13 covers the coated surfaces of the wires 7 as well as the surfaces of the guard ring 11 for electrically isolating the silicon layers from metal wiring.

The first interlayer insulating layer 13 has a moat-like contact hole 15 defined above and along the silicon guard ring 11. The contact hole 15 is filled with metal to form a generally rectangular ring-shaped, closed first via guard ring 17 within the interlayer insulating layer 13.

The first interlayer insulating layer 13 also has a pair of symmetrically disposed via holes 63, one defined above one of the paired silicon wires 7, which are filled with metal to form a pair of interlayer vias 65 penetrating the interlayer insulating layer 13. The interlayer vias 65 are formed simultaneously with the first via guard ring 17.

Above the first interlayer insulating layer 13 is a generally rectangular ring-shaped, closed first metal guard ring 19 formed of metal deposited on and along the first via guard ring 17.

On the first interlayer insulating layer 13 lies a metal fuse 67 with a pair of metal wires 69 each extending from one end of the metal fuse 67 to connect to the interlayer via 65.

With the wiring provided within and across the insulating layers, the metal fuse 67 has each end electrically connected first to the metal wire 69, and then to the silicon wire 7 through the interlayer via 65, which eventually conducts voltage to the circuitry outside the guard rings used in conjunction with the fuse 67.

Disposed on the first interlayer insulating layer 13 is a second interlayer insulating layer 21 for electrically isolating metal wires from each other, which covers the surfaces of the first metal guard ring 19 as well as those of the metal fuse 67 and the metal wires 69. The second interlayer insulating layer 21 has a via hole 23 defined above and along the first metal guard ring 19. The via hole 23 is filled with metal to form a generally rectangular ring-shaped, closed second via guard ring 25 within the second interlayer insulating layer 21.

Above the second interlayer insulating layer 21 is a generally rectangular ring-shaped, closed second metal guard ring 27 formed of metal deposited on and along the second via guard ring 25.

Finally, the semiconductor device 1*f* is topped by a final passivation or insulating layer 29 disposed on the second interlayer insulating layer 21 to cover the surfaces of the second metal guard ring 27.

The semiconductor device 1*f* has a fuse window 31 defined in at least one of the insulating layers 21 and 29 inside the layered guard rings 11, 17, 19, 25, and 27, wherein no insulating layer or an insulating layer thinner than that at the other portions is disposed above the metal fuse 67 to provide access to the metal fuse 67 with relatively thin insulation therethrough.

In such a configuration, the semiconductor device 1*f* according to this patent specification is highly immune to leaking atmospheric moisture and other contaminants into the internal circuitry. That is, the silicon guard ring 11, the first via guard ring 17, the first metal guard ring 19, the second via guard ring 25, and the second metal guard ring 27, which are all formed in a closed configuration and layered one atop another, together form a sealing structure that encloses the metal fuse 67 as well as the fuse window 31 disposed above the fuse 5, so that there is substantially no pathway for contaminants to leak into the internal circuitry through the interlayer insulating layers, except for a very limited zone in which the insulation coating 9 extends between the adjoining surfaces of the silicon wire 7 and the silicon guard ring 11.

Although the above description depicts the first embodiment arranged for use with a metal fuse instead of a silicon fuse, similar arrangement is possible with all the embodiments of the semiconductor device according to this patent specification.

Further, the configurations of the metal fuse and the metal wires used in the semiconductor device may be other than those depicted in the embodiment above. For example, the metal fuse may be disposed on the second interlayer insulating layer on which the second metal guard ring is formed, or on any layer on which a patterned metal film, such as one for providing metal resistors, is disposed.

Numerous additional modifications and variations are possible in light of the above teachings. For example, although in several embodiments disclosed herein, the semiconductor device has two interlayer insulating layers to provide two levels of metal wiring, the number of interlayer insulating layer and its associated structure may be other than that depicted in those embodiments. It is therefore to be understood that within the scope of the appended claims, the disclosure of this patent specification may be practiced otherwise than as specifically described herein.

This patent specification is based on Japanese patent application No. 2009-170762, filed on Jul. 22, 2009 in the Japanese Patent Office, the entire contents of which are hereby incorporated by reference herein.

What is claimed is:

1. A semiconductor device comprising:
   a semiconductor substrate;
   a base insulating layer disposed over the semiconductor substrate for insulation;
   a silicon fuse disposed on the base insulating layer;
   a pair of silicon wires disposed on the base insulating layer, each extending from one end of the silicon fuse;
   a generally ring-shaped, closed silicon guard ring disposed on the base insulating layer to surround, in plan view, the silicon fuse, while overlapping the silicon wires at points where the silicon wires extend beyond the silicon guard ring,
   the silicon fuse and the silicon wires being formed of a first patterned silicon layer deposited on the base insulating layer,
   the silicon guard ring being formed of a second patterned silicon layer, different from the first patterned silicon layer, deposited on the base insulating layer;
   an insulation coating deposited at least over surfaces of the silicon wires to electrically isolate the silicon wires from the silicon guard ring at the points of overlap, the insulation coating comprising an oxidized surface of the silicon wire, and
   the insulation coating having a thickness of approximately 0.05 to 0.2 micrometers;

a first interlayer insulating layer, thicker than the insulation coating, disposed on the base insulating layer to cover the silicon fuse, the silicon wires, and the silicon guard ring for insulation;

a generally ring-shaped, closed via guard ring formed of metal filling a via hole defined in the interlayer insulating layer on and along the silicon guard ring to surround, in plan view, the silicon fuse;

a generally ring-shaped, closed metal guard ring formed of metal deposited above the interlayer insulating layer on and along the via guard ring to surround, in plan view, the silicon fuse;

a final insulating layer disposed on the interlayer insulating layer to cover the metal guard ring for insulation; and a fuse window defined in at least one of the insulating layers above the silicon fuse inside the guard rings to provide access to the silicon fuse with relatively thin insulation therethrough.

2. The semiconductor device according to claim 1, wherein the insulation coating is formed by oxidizing the surfaces of the silicon wires.

3. The semiconductor device according to claim 1, wherein the insulation coating is formed of silicon nitride.

4. The semiconductor device according to claim 1, further comprising a capacitor having a pair of first and second electrodes with a dielectric layer interposed therebetween, the first electrode being formed of the first patterned silicon layer disposed on the base insulating layer outside and away from the silicon guard ring, the dielectric layer being formed of the insulation coating deposited on the first patterned silicon layer, the second electrode being formed of the second patterned silicon layer disposed on the insulation coating above the first patterned silicon layer.

5. The semiconductor device according to claim 1, further comprising:

a stack of one or more additional, second interlayer insulating layers disposed between the first interlayer insulating layer and the final insulating layer;

a set of one or more additional, generally ring-shaped, closed via guard rings, each formed of metal filling a via hole defined in the second interlayer insulating layer along the underlying guard rings to surround, in plan view, the silicon fuse; and a set of one or more additional, generally ring-shaped, closed metal guard ring each formed of metal deposited above the second interlayer insulating layer along the underlying guard rings to surround, in plan view, the silicon fuse.

6. A semiconductor device comprising:

a semiconductor substrate;

a base insulating layer disposed over the semiconductor substrate for insulation;

an interlayer insulating layer disposed above the base insulating layer for insulation;

a metal fuse disposed on the interlayer insulating layer;

a pair of silicon wires disposed on the base insulating layer below the interlayer insulting layer, each connected to one end of the metal fuse through a via penetrating the interlayer insulating layer;

a generally ring-shaped, closed silicon guard ring disposed on the base insulating layer to surround, in plan view, the metal fuse, while overlapping the silicon wires at points where the silicon wires extend beyond the silicon guard ring, the silicon wires being formed of a first patterned silicon layer deposited on the base insulating layer, the silicon guard ring being formed of a second patterned silicon layer, different from the first patterned silicon layer, deposited on the base insulating layer;

an insulation coating on each of the silicon wires to electrically isolate the silicon wires from the silicon guard ring at the points of overlap, the insulation coating comprising an oxidized surface of the silicon wire, and the insulation coating having a thickness of approximately 0.05 to 0.2 micrometers;

a generally ring-shaped, closed via guard ring formed of metal filling a via hole defined in the interlayer insulating layer on and along the silicon guard ring to surround, in plan view, the metal fuse;

a generally ring-shaped, closed metal guard ring formed of metal deposited above the interlayer insulating layer on and along the via guard ring to surround, in plan view, the metal fuse;

a final insulating layer disposed on the interlayer insulating layer to cover the metal guard ring for insulation; and a fuse window defined in at least the final insulating layer above the metal fuse inside the guard rings to provide access to the metal fuse with relatively thin insulation therethrough.

7. A semiconductor device comprising:

a semiconductor substrate;

a base insulating layer disposed over the semiconductor substrate for insulation;

a silicon fuse disposed on the base insulating layer;

a pair of silicon wires disposed on the base insulating layer, each extending from one end of the silicon fuse;

a generally ring-shaped, closed silicon guard ring disposed on the base insulating layer to surround, in plan view, the silicon fuse, while overlapping the silicon wires at points where the silicon wires extend beyond the silicon guard ring, the silicon fuse and the silicon wires being formed of a first patterned silicon layer deposited on the base insulating layer, the silicon guard ring being formed of a second patterned silicon layer, different from the first patterned silicon layer, deposited on the base insulating layer; and an insulation coating on each of the silicon wires to electrically isolate the silicon wires from the silicon guard ring at the points of overlap, the insulation coating comprising an oxidized surface of the silicon wire, and the insulation coating having a thickness of approximately 0.05 to 0.2 micrometers.

8. The semiconductor device according to claim 7, further comprising:

a first interlayer insulating layer, thicker than the insulation coating, disposed on the base insulating layer to cover the silicon fuse, the silicon wires, and the silicon guard ring for insulation;

a generally ring-shaped, closed via guard ring formed of metal filling a via hole defined in the interlayer insulating layer on and along the silicon guard ring to surround, in plan view, the silicon fuse;

a generally ring-shaped, closed metal guard ring formed of metal deposited above the interlayer insulating layer on and along the via guard ring to surround, in plan view, the silicon fuse;

a final insulating layer disposed on the interlayer insulating layer to cover the metal guard ring for insulation; and a fuse window defined in at least one of the insulating layers above the silicon fuse inside the guard rings to provide access to the silicon fuse with relatively thin insulation therethrough.

* * * * *